(12) United States Patent
Zou

(10) Patent No.: US 11,262,376 B2
(45) Date of Patent: Mar. 1, 2022

(54) MEMS DEVICE AND ELECTRONIC APPARATUS

(71) Applicant: GOERTEK INC., Weifang (CN)

(72) Inventor: Quanbo Zou, Weifang (CN)

(73) Assignee: WEIFANG GOERTEK MICROELECTRONICS CO., LTD., Shandong (CN)

( * ) Notice: Subject to any disclaimer, the term of this patent is extended or adjusted under 35 U.S.C. 154(b) by 182 days.

(21) Appl. No.: 16/078,213

(22) PCT Filed: Jun. 2, 2016

(86) PCT No.: PCT/CN2016/084544
§ 371 (c)(1),
(2) Date: Aug. 21, 2018

(87) PCT Pub. No.: WO2017/206149
PCT Pub. Date: Dec. 7, 2017

(65) Prior Publication Data
US 2019/0079110 A1    Mar. 14, 2019

(51) Int. Cl.
*G01P 3/36* (2006.01)
*G01P 15/093* (2006.01)
*B81B 5/00* (2006.01)
*B81C 1/00* (2006.01)

(52) U.S. Cl.
CPC .............. *G01P 15/093* (2013.01); *B81B 5/00* (2013.01); *B81C 1/00134* (2013.01); *B81C 1/00261* (2013.01); *G01P 3/36* (2013.01)

(58) Field of Classification Search
CPC .............. B81B 7/04; B81B 2201/0235; B81B 2201/0264; B81B 2201/047; B81B 2203/0118; B81B 2203/0154; B81C 1/00134; B81C 1/00261; B81C 1/00317; G01P 3/36; G01P 15/093
See application file for complete search history.

(56) References Cited

U.S. PATENT DOCUMENTS

| 5,689,107 A  | * | 11/1997 | Hsu | .......................... G01D 5/30 |
| | | | | 250/231.1 |
| 6,494,095 B1 | * | 12/2002 | Wan | .................... G01P 15/0891 |
| | | | | 73/514.26 |
| 8,426,227 B1 | * | 4/2013 | Bibi | ........................ H01L 33/28 |
| | | | | 438/27 |
| 2009/0174885 A1 | * | 7/2009 | Li | ........................ G01J 9/0246 |
| | | | | 356/451 |
| 2014/0064904 A1 | | 3/2014 | Bibl et al. | |
| 2015/0028362 A1 | | 1/2015 | Chan et al. | |

(Continued)

FOREIGN PATENT DOCUMENTS

CN    104904001 A    9/2015
WO    2008013368 A1    1/2008

*Primary Examiner* — Reema Patel
(74) *Attorney, Agent, or Firm* — Saliwanchik, Lloyd & Eisenschenk

(57) ABSTRACT

The present invention discloses a MEMS device and electronic apparatus. The MEMS device comprises: a micro-LED; and a movable member, wherein the micro-LED is mounted on the movable member and is configured for moving with the movable member. According to an embodiment of this invention, the signal detection of a MEMS device can be simplified and/or the contents of signals produced by the MEMS device can be enriched.

7 Claims, 2 Drawing Sheets

(56) References Cited

U.S. PATENT DOCUMENTS

2015/0338246 A1* 11/2015 Robert .................... H01G 5/14
                                                    324/661
2016/0140685 A1   5/2016 Ren et al.
2019/0013275 A1*  1/2019 Sunshine ............... H05K 1/038

* cited by examiner

MEMS DEVICE AND ELECTRONIC APPARATUS

CROSS REFERENCE TO RELATED APPLICATIONS

This application is a National Stage of International Application No. PCT/CN2016/084544 filed on Jun. 2, 2016, which is hereby incorporated by reference in its entirety.

FIELD OF THE INVENTION

The present invention relates to the technology of MEMS, and in particular, to a MEMS device and electronic apparatus.

BACKGROUND OF THE INVENTION

The micro-LED technology refers to the LED array of small size integrated on a substrate with high density. For example, the US patent U.S. Pat. No. 8,426,227B1 granted on Apr. 23, 2013 discloses a method of forming a micro light emitting diode array, which is hereby incorporated herein by reference. Currently, the micro-LED technology is mainly used for generating 2d images on a stationary surface.

The Micro-Electro-Mechanical Systems, or MEMS, refers to a miniaturized mechanical and electro-mechanical members (i.e., devices and structures) that are made using the techniques of microfabrication. The MEMS devices can have some mechanical functionality. For example, it may have a member which can move under the control of integrated microelectronics. In another aspect, it can convert a measured mechanical signal into an electrical signal.

In the prior art, the signals are generally produced by the mechanical member per se. The variety of the signals of such a MEMS device is limited.

Therefore, it is demanded that a new technique shall be proposed to address at least one of the problems in the prior art.

SUMMARY OF THE INVENTION

One object of this invention is to provide a new technical solution for MEMS device.

According to a first aspect of the present invention, there is provided a MEMS device, comprising: a micro-LED; and a movable member, wherein the micro-LED is mounted on the movable member and is configured for moving with the movable member.

Alternatively or in addition, the MEMS device further comprises: at least one optical detector, wherein the at least one optical detector is mounted adjacent to the micro-LED and is configured for sensing the light emitted by the micro-LED.

Alternatively or in addition, the at least one optical detector includes a first optical detector and a second optical detector, the first optical detector is mounted to face the micro-LED and is configured for sensing the light in the front of the micro-LED, and the second optical detector is mounted in the lateral direction of the micro-LED and is configured for sensing the light in the lateral direction of the micro-LED.

Alternatively or in addition, the movable member is configured for moving according to the at least one of the following factors: acceleration of the MEMS device, angular speed of the MEMS device, pressure applied on the movable member, force applied on the movable member and flow applied on the movable member.

Alternatively or in addition, the at least one optical detector is configured for sensing a mechanical displacement of the micro-LED caused by the movement of the movable member and outputting a sensing signal reflecting the mechanical displacement.

Alternatively or in addition, the movable member is configured for being actuated to move by an electronic signal or electromagnetic signal applied thereon, and the micro-LED is configured for emitting a light signal modulated by the movement of the movable member.

Alternatively or in addition, the modulated light signal is fed into an optic fiber.

Alternatively or in addition, a plurality of the micro-LEDs are mounted on a plurality of the movable members on a display panel, respectively.

Alternatively or in addition, the plurality of the movable members are configured for moving to form angles with the plane of the display panel, respectively, so that the light emitted by the plurality of the micro-LEDs form a 3D image.

According to a second aspect of the present invention, there is provided an electronic apparatus, comprising the MEMS device according to the present invention.

According to an embodiment of this invention, the signal detection of a MEMS device can be simplified and/or the contents of signals produced by the MEMS device can be enriched.

Further features of the present invention and advantages thereof will become apparent from the following detailed description of exemplary embodiments according to the present invention with reference to the attached drawings.

BRIEF DISCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
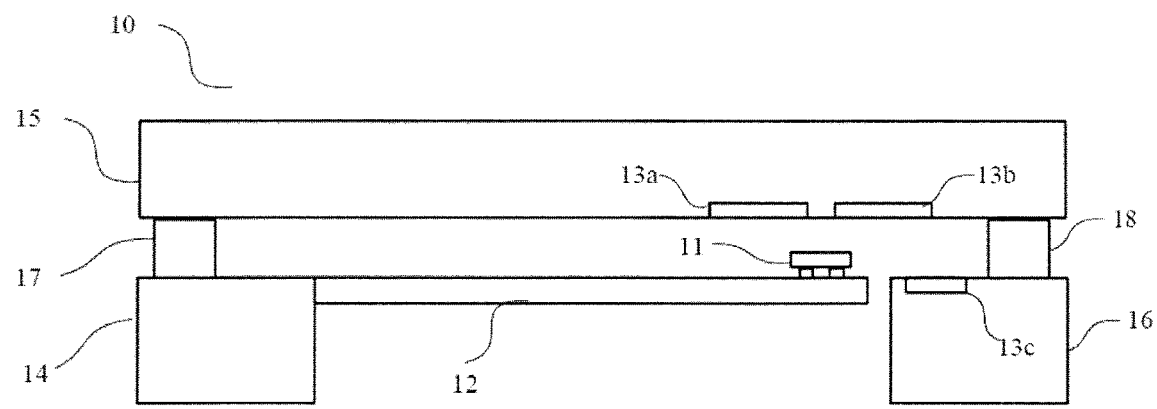
FIG. 1 is a schematic diagram of a portion of a MEMS device according to a first embodiment.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the embodiments of this invention, unlike the prior art, a micro-LED is provided on a movable member of a MEMS device so that a signal reflecting the movement of the movable member can easily be produced and/or detected. For example, the MEMS device is a MEMS chip.

The embodiments and examples will be illustrated with reference to the figures.

FIG. 1 shows a schematic diagram of a portion of a MEMS device according to a first embodiment.

As shown in FIG. 1, the MEMS device 10 comprises a micro-LED 11 and a movable member 12. The micro-LED 11 is mounted on the movable member 12 and is configured for moving with the movable member 12. The movable member 12 can be any of cantilever, beam, plate, membrane, torsional plate, rotational platform and so on, for example.

Because the micro-LED 11 can move according to the movement of the movable member 12, the light emitted by the micro-LED 11 can reflect the movement of the movable member 12.

As shown in FIG. 1, the MEMS device 10 further comprises at least one optical detector 13a, 13b, 13c. For example, the at least one optical detector 13a, 13b, 13c is a photo diode. The at least one optical detector 13a, 13b, 13c is mounted adjacent to the micro-LED 11 and is configured for sensing the light emitted by the micro-LED 11. The mechanical displacement of the micro-LED will lead to signal output in the at least one optical detector 13a, 13b, 13c.

In an example, the at least one optical detector 13a, 13b, 13c includes a first optical detector 13a or 13b and a second optical detector 13c. The first optical detector 13a or 13 is mounted to face the micro-LED 11 and is configured for sensing the light in the front of the micro-LED 11. The second optical detector 13c is mounted in the lateral direction of the micro-LED 11 and is configured for sensing the light in the lateral direction of the micro-LED 11.

For example, the movable member 12 is configured for moving according to the at least one of the following factors: acceleration of the MEMS device, angular speed of the MEMS device, pressure applied on the movable member, force applied on the movable member and flow applied on the movable member. The movement of the movable member 12 will cause a mechanical displacement of the micro-LED 11. The light emitted by the micro-LED 11 will displace along with the mechanical displacement of the micro-LED 11. The at least one optical detector 13a, 13b, 13c is configured for sensing and outputting a sensing signal reflecting such a mechanical displacement, for example, through sensing the displacement of the light emitted by the micro-LED 11.

In such a configuration, the MEMS device can easily convert these physical quantities into a light signal and/or an electronic signal.

For example, the micro-LED size is 1-100 μm in side length and 1-10 μm in thickness. The micro-LED can emitted red light, green light, blue light or UV, etc.

As shown in FIG. 1, the movable member 12 is mounted on a substrate 14. The substrate 14 can be any of silicon, other semiconductor, glass, ceramic, quartz, sapphire, etc.

The optical detectors 13a, 13b are mounted on a cap 15. Thus, the cap 15 is a detector. The cap 15 is connected with the substrate 14 via a bond line 17. The optical detector 13c is mounted on another substrate 16, which can also be called a detector. The detector 16 is connected with the cap 15 via a bond line 18.

In this embodiment, the micro-LED is used to produce signals reflecting the movement of a movable member of a MEMS device. This configuration simplifies the signal detection of a MEMS device and/or enriches the contents of signals produced by the MEMS device.

Figure 2:
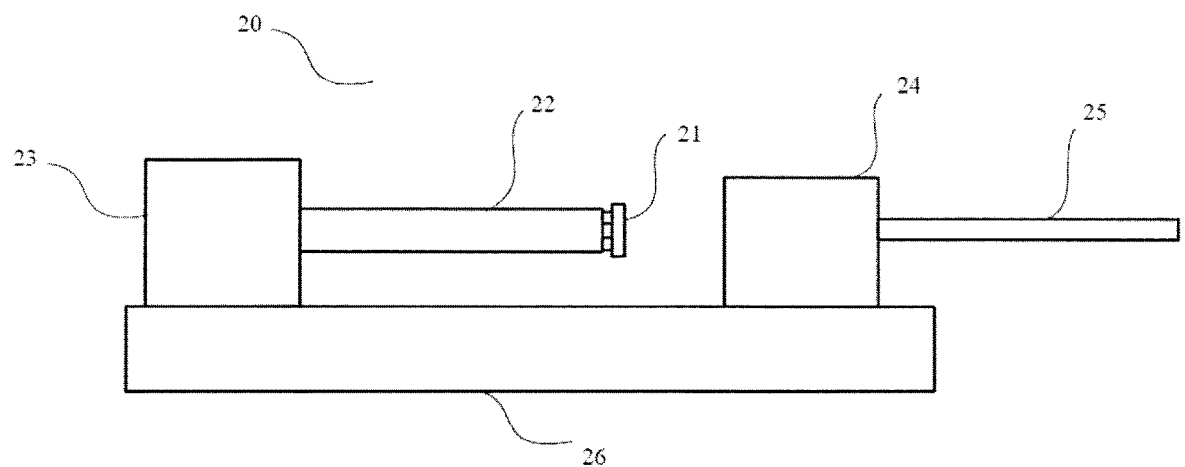
FIG. 2 is a schematic diagram of a portion of a MEMS device according to a second embodiment.

FIG. 2 is a schematic diagram of a portion of a MEMS device according to a second embodiment. The repetitive contents with the first embodiment will be omitted.

As shown in FIG. 2, the MEMS device 20 comprises a micro-LED 21 and a movable member 22. The micro-LED 21 is mounted on the movable member 22 and is configured for moving with the movable member 22.

The movable member 22 is supported by the support member 23. The support member 23 is mounted on the substrate 26.

In this embodiment, the MEMS device 20 can be used as a modulator. For example, the movable member 22 is configured for being actuated to move by an electronic signal or electromagnetic signal applied thereon. The electronic signal or electromagnetic signal can be applied through the support substrate 23 and the substrate 26. The micro-LED 21 is configured for emitting a light signal modulated by the movement of the movable member.

For example, the modulated light signal is directly fed into an optic fiber 25. For example, as shown in FIG. 2, a coupler 24 is provided on the substrate 26 and is used to couple or feed the modulated light signal into an optic fiber 25.

It will be appreciated by a person skilled in the art that although FIG. 2 shows a light modulation, the coupler 24 can be replaced by an optical detector, such as a photo diode, and the optic fiber 25 can be replaced by a wire. In such a situation, the modulated signal can be an electronic signal and be transmitted by the wire.

This embodiment provides a new solution of modulation. By this embodiment, a new MEMS modulator can be provided.

Figure 3:
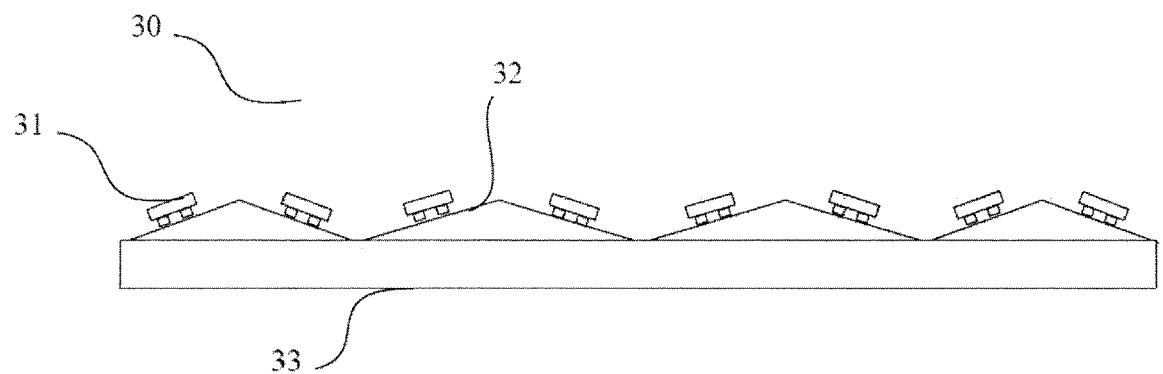
FIG. 3 is a schematic diagram of a portion of a MEMS device according to a third embodiment.

FIG. 3 is a schematic diagram of a portion of a MEMS device according to a third embodiment. The repetitive contents with the first embodiment will be omitted.

As shown in FIG. 3, the MEMS device 30 comprises a plurality of micro-LEDs 31 and a plurality of movable members 32. The plurality of the micro-LEDs 31 are mounted on the plurality of movable members 32 on a display panel 33, respectively.

The plurality of the movable members 32 are configured for moving to form angles with the plane of the display panel 33, respectively, so that the light emitted by the plurality of the micro-LEDs 31 form a 3D image.

Figure 4:
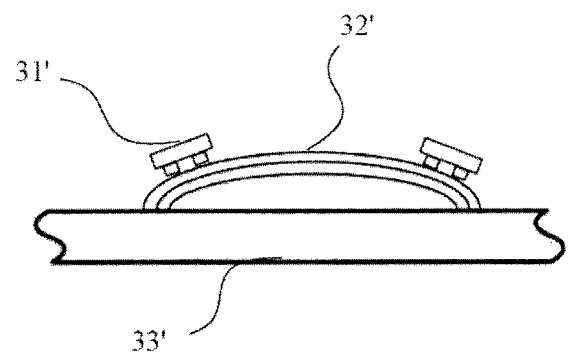
FIG. 4 is a schematic diagram of an example of a movable member of the MEMS device in FIG. 3.

A person skilled in the art can conceive many approaches for forming such movable members 32. An example of such movable members 32 will be illustrated with reference to FIG. 4. FIG. 4 shows a schematic diagram of an example of a movable member of the MEMS device in FIG. 3.

As shown in FIG. 4, the movable member 32' can be of electrostriction material, for example. The movable member 32' can be deformed under electronic signal so that the angles of the movable members 32' (and thus the micro-LEDs 31') with respect to the display panel 33' can be adjusted.

Through adjusting the angles of the micro-LEDs 31' with respect to the display panel 33', a 3D image can be produced.

This embodiment provides a new solution for 3D display.

Figure 5:
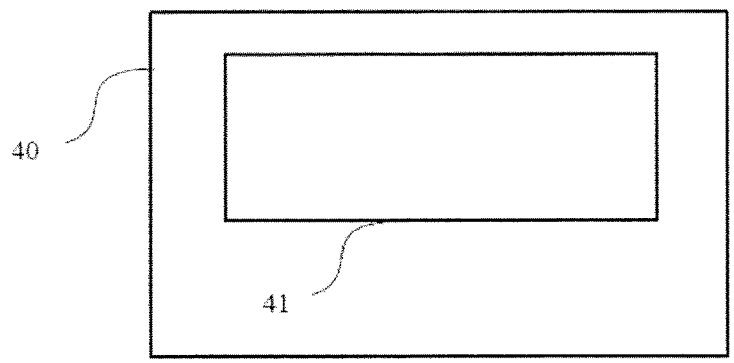
FIG. 5 shows an electronic apparatus with a MEMS device according to embodiments of this invention.

FIG. 5 shows an electronic apparatus with a MEMS device according to embodiments of this invention.

As shown in FIG. 5, the electronic apparatus 40 comprises a MEMS device 41. The MEMS device 41 can be any of the MEMS devices shown in FIGS. 1, 2 and 3.

As such, the electronic apparatus 40 could be a detector for detecting acceleration, angular speed, pressure, force or flow, etc. Alternatively, the electronic apparatus 40 could be a modulator for modulating light and/or electronic signal. Alternatively, the electronic apparatus 40 could be a display apparatus for displaying a 3D image.

In the embodiments of this invention, a MEMS device with a micro-LED mounted on a movable member thereof is provided, so that the signal detection of a MEMS device is simplified and/or the contents of signals produced by the MEMS device is enriched.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A MEMS device, comprising:
    a cap;
    a first substrate and a second substrate opposite to the first substrate, the first substrate and the second substrate being connected with each end of the cap via a bond line, respectively;
    a movable member mounted on the first substrate;
    a micro-LED mounted on the movable member and configured for moving with the movable member;
    a first optical detector and a second optical detector mounted on the cap to face the micro-LED and configured for sensing light in a front of the micro-LED; and
    a third optical detector mounted in a lateral direction of the micro-LED and configured for sensing light in the lateral direction of the micro-LED.

2. The MEMS device according to claim 1, wherein the movable member is configured for moving according to the at least one of the following factors: acceleration of the MEMS device, pressure applied on the movable member, and force applied on the movable member.

3. The MEMS device according to claim 2, wherein at least one of the first optical detector, the second optical detector, and the third optical detector is configured for sensing a mechanical displacement of the micro-LED caused by the movement of the movable member and outputting a sensing signal reflecting the mechanical displacement.

4. An electronic apparatus, comprising the MEMS device according to claim 1.

5. The MEMS device according to claim 1,
    wherein at least one of the first optical detector, the second optical detector, and the third optical detector is configured for sensing a displacement of the light emitted by the micro-LED.

6. The MEMS device according to claim 1, wherein the movable member is configured for moving according to a flow applied on the movable member.

7. The MEMS device according to claim 1, wherein the movable member is configured for moving according to an angular speed of the MEMS device.

* * * * *